(12) United States Patent
Hu et al.

(10) Patent No.: US 10,930,361 B2
(45) Date of Patent: Feb. 23, 2021

(54) VOLTAGE CONTROL CIRCUIT, SHIFT REGISTER UNIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Shenghua Hu, Beijing (CN); Chunyang Nie, Beijing (CN); Ke Dai, Beijing (CN); Kun Yang, Beijing (CN); Ruilian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 21 days.

(21) Appl. No.: 16/446,141

(22) Filed: Jun. 19, 2019

(65) Prior Publication Data

US 2020/0082896 A1    Mar. 12, 2020

(30) Foreign Application Priority Data

Sep. 10, 2018   (CN) .......................... 201811050824.4

(51) Int. Cl.
*G11C 19/28*    (2006.01)
*G09G 3/20*    (2006.01)

(52) U.S. Cl.
CPC ............. *G11C 19/287* (2013.01); *G09G 3/20* (2013.01); *G09G 2300/0426* (2013.01); *G09G 2300/0809* (2013.01); *G09G 2310/0286* (2013.01); *G09G 2310/08* (2013.01); *G09G 2330/021* (2013.01)

(58) Field of Classification Search
CPC ................... G11C 19/287; G09G 3/20; G09G 2300/0426; G09G 2300/0809; G09G 2310/0286; G09G 2310/08; G09G 2330/021
See application file for complete search history.

(56) References Cited

U.S. PATENT DOCUMENTS

| | | | |
|---|---|---|---|
| 2010/0079443 A1* | 4/2010 | Chang .................. | G09G 3/3677 345/214 |
| 2015/0325188 A1* | 11/2015 | Wei ....................... | G09G 3/3648 345/92 |
| 2015/0348507 A1* | 12/2015 | Zhang ....................... | G09G 5/18 345/213 |
| 2016/0351124 A1* | 12/2016 | Kim ....................... | G09G 3/3241 |
| 2020/0098316 A1* | 3/2020 | Yokoyama ........... | G09G 3/3258 |

* cited by examiner

*Primary Examiner* — Amare Mengistu
*Assistant Examiner* — Jennifer L Zubajlo
(74) *Attorney, Agent, or Firm* — Brooks Kushman P.C.

(57) ABSTRACT

A voltage control circuit, a shift register unit, and a display device are provided. The voltage control circuit is applied to a shift register unit, the shift register unit includes a gate-driving-signal output end, and the voltage control circuit includes a discharge control end, a discharge circuit and a discharge voltage end. The discharge circuit is configured to, under control of a signal inputted by the discharge control end, control to electrically disconnect the gate-driving-signal output end from the discharge voltage end during a display period of a display screen, and control to electrically connect the gate-driving-signal output end to the discharge voltage end during a shutdown period of the display screen.

20 Claims, 6 Drawing Sheets

VOLTAGE CONTROL CIRCUIT, SHIFT REGISTER UNIT AND DISPLAY DEVICE

CROSS-REFERENCE TO RELATED APPLICATIONS

This application claims priority to Chinese Patent Application No. 201811050824.4 filed on Sep. 10, 2018, which is incorporated herein by reference in its entirety.

TECHNICAL FIELD

The present disclosure relates to the field of display technologies, and in particular to a voltage control circuit, a shift register unit, and a display device.

BACKGROUND

In the related art, when a display screen is shutdown, a gate driving circuit of a shift register unit is connected to a low voltage end, so that a corresponding gate driving signal is unable to fully turn on corresponding Thin Film Transistor (TFT) included in a pixel circuit, thus remaining electrical charges in a pixel cannot be fully released, and afterimage phenomenon will appear on the display screen upon the display screen being shut down.

SUMMARY

A main object of the present disclosure is to provide a voltage control circuit, a shift register unit, and a display device.

In one aspect, the present disclosure provides a voltage control circuit applied to a shift register unit, the shift register unit includes a gate-driving-signal output end, and the voltage control circuit includes a discharge control end, a discharge circuit and a discharge voltage end; wherein The discharge circuit is configured to, under control of a signal inputted by the discharge control end, control to electrically disconnect the gate-driving-signal output end from the discharge voltage end during a display period of a display screen, and control to electrically connect the gate-driving-signal output end to the discharge voltage end during a shutdown period of the display screen.

Optionally, the discharge voltage end is configured to output a discharge voltage during the shutdown period of the display screen.

Optionally, a pixel circuit connected to the gate-driving-signal output end includes a TFT, wherein the TFT is an N-type transistor, and a voltage value of the discharge voltage is positive; or The TFT is a P-type transistor, and the voltage value of the discharge voltage is negative.

Optionally, an absolute value of the discharge voltage is greater than or equal to 22V.

Optionally, the discharge circuit includes a discharge transistor; and A gate electrode of the discharge transistor is connected to the discharge control end, a first electrode of the discharge transistor is connected to the discharge voltage end, and a second electrode of the discharge transistor is connected to the gate-driving-signal output end.

Optionally, the discharge voltage end includes a first discharge voltage end and a second discharge voltage end; the discharge circuit includes a first discharge transistor and a second discharge transistor; a control electrode of the first discharge transistor is connected to the discharge control end, a first electrode of the first discharge transistor is connected to the first discharge voltage end, and a second electrode of the first discharge transistor is connected to the gate-driving-signal output end; and a control electrode of the second discharge transistor is connected to the discharge control end, a first electrode of the second discharge transistor is connected to the gate-driving-signal output end, and a second electrode of the second discharge transistor is connected to the second discharge voltage end.

Optionally, the discharge voltage end includes a clock signal input end; the discharge circuit includes a discharge transistor; and a control electrode of the discharge transistor is connected to the discharge control end, a first electrode of the discharge transistor is connected to the clock signal input end, and a second electrode of the discharge transistor is connected to the gate-driving-signal output end.

Optionally, the voltage control circuit is configured to eliminate afterimage existing during a period of shutting down the display screen.

In another aspect, the present disclosure further provides a shift register unit including the above voltage control circuit.

Optionally, the shift register unit according to the present disclosure further includes the gate-driving-signal output end, a pull-up node control circuit, a pull-down node control circuit, an output circuit, and an output reset circuit; wherein the output reset circuit is connected to a pull-down node, the gate-driving-signal output end, and a first voltage end, and is configured to control to electrically connect the gate-driving-signal output end to the first voltage end under control of a potential of the pull-down node; the pull-up node control circuit is connected to an input end, an initial reset end, a pull-up node, a pull-down node, a pull-up reset end, and a second voltage end, and is configured to control a potential of the pull-up node under control of an input signal, an initial reset signal, the potential of the pull-down node, and a pull-up reset signal, wherein the input end is configured to receive the input signal, the initial reset end is configured to receive the initial reset signal, and the pull-up reset end is configured to receive the pull-up reset signal; the pull-down node control circuit is connected to a first power voltage end, the pull-up node, the pull-down node and the second voltage end, and is configured to control the potential of the pull-down node under control of the potential of the pull-up node; the output circuit is connected to the pull-up node, the gate-driving-signal output end, and a clock signal input end, and is configured to control to electrically connect the gate-driving-signal output end to the clock signal input end under the control of the potential of the pull-up node; and the discharge control end of the voltage control circuit includes the first voltage end, and the discharge voltage end of the voltage control circuit includes the first power voltage end or the clock signal input end.

Optionally, the pull-down node control circuit includes a first pull-down control sub-circuit and a second pull-down control sub-circuit, the first power voltage end includes a second power voltage end and a third power voltage end; and the pull-down node includes a first pull-down node and a second pull-down node; the first pull-down control sub-circuit is connected to the first pull-down node, the pull-up node, the second power voltage end, and the second voltage end, and is configured to control a potential of the first pull-down node under the control of the potential of the pull-up node; and the second pull-down control sub-circuit is connected to the second pull-down node, the pull-up node, the third power voltage end, and the second voltage end, and is configured to control a potential of the second pull-down node under the control of the potential of the pull-up node.

Optionally, the first pull-down control sub-circuit includes a first pull-down control transistor, a second pull-down control transistor, a third pull-down control transistor, and a fourth pull-down control transistor; a control electrode of the first pull-down control transistor and a first electrode of the first pull-down control transistor are both connected to the second power voltage end; a control electrode of the second pull-down control transistor is connected to the pull-up node, a first electrode of the second pull-down control transistor is connected to the second voltage end, and a second electrode of the second pull-down control transistor is connected to a second electrode of the first pull-down control transistor; a control electrode of the third pull-down control transistor is connected to the second electrode of the first pull-down control transistor, and a first electrode of the third pull-down control transistor is connected to the second power voltage end; and a control electrode of the fourth pull-down control transistor is connected to the pull-up node, a first electrode of the fourth pull-down control transistor is connected to a second electrode of the third pull-down control transistor, and a second electrode of the fourth pull-down control transistor is connected to the second voltage end.

Optionally, the second pull-down control sub-circuit includes a fifth pull-down control transistor, a sixth pull-down control transistor, a seventh pull-down control transistor, and an eighth pull-down control transistor; a control electrode of the fifth pull-down control transistor and a first electrode of the fifth pull-down control transistor are both connected to the third power voltage end; a control electrode of the sixth pull-down control transistor is connected to the pull-up node, a first electrode of the sixth pull-down control transistor is connected to the second voltage end, and a second electrode of the sixth pull-down control transistor is connected to a second electrode of the fifth pull-down control transistor; a control electrode of the seventh pull-down control transistor is connected to the second electrode of the fifth pull-down control transistor, and a first electrode of the seventh pull-down control transistor is connected to the third power voltage end; and a control electrode of the eighth pull-down control transistor is connected to the pull-up node, a first electrode of the eighth pull-down control transistor is connected to a second electrode of the seventh pull-down control transistor, and a second electrode of the eighth pull-down control transistor is connected to the second voltage end.

Optionally, the output reset circuit includes a first output reset transistor and a second output reset transistor; a control electrode of the first output reset transistor is connected to the first pull-down node, a first electrode of the first output reset transistor is connected to the gate-driving-signal output end, and a second electrode of the first output reset transistor is connected to the first voltage end; and a control electrode of the second output reset transistor is connected to the second pull-down node, a first electrode of the second output reset transistor is connected to the first voltage end, and a second electrode of the second output reset transistor is connected to the gate-driving-signal output end.

Optionally, the output circuit includes an output transistor and a storage capacitor; a control electrode of the output transistor is connected to the pull-up node, a first electrode of the output transistor is connected to the clock signal input end, and a second electrode of the output transistor is connected to the gate-driving-signal output end; and a first end of the storage capacitor is connected to the pull-up node, and a second end of the storage capacitor is connected to the gate-driving-signal output end.

Optionally, the pull-up node control circuit includes a first pull-up control transistor, a second pull-up control transistor, a third pull-up control transistor, a fourth pull-up control transistor, and a fifth pull-up control transistor; a control electrode of the first pull-up control transistor and a first electrode of the first pull-up control transistor are both connected to the input end, and a second electrode of the first pull-up control transistor is connected to the pull-up node; a control electrode of the second pull-up control transistor is connected to the initial reset end, a first electrode of the second pull-up control transistor is connected to the pull-up node, and a second electrode of the second pull-up control transistor is connected to the second voltage end; a control electrode of the third pull-up control transistor is connected to a first pull-down node, a first electrode of the third pull-up control transistor is connected to the second voltage end, and a second electrode of the third pull-up control transistor is connected to the pull-up node; a control electrode of the fourth pull-up control transistor is connected to a second pull-down node, a first electrode of the fourth pull-up control transistor is connected to the pull-up node, and a second electrode of the fourth pull-up control transistor is connected to the second voltage end; and a control electrode of the fifth pull-up control transistor is connected to the pull-up reset end, a first electrode of the fifth pull-up control transistor is connected to the pull-up node, and a second electrode of the fifth pull-up control transistor is connected to the second voltage end.

Optionally, the shift register unit further includes a reset circuit; the reset circuit is connected to the pull-up node, the first pull-down node, the second pull-down node, the first power voltage end and the clock signal input end, and is configured to control to electrically connect the clock signal input end to the second voltage end under control of the potential of the pull-up node, the potential of the first pull-down node, and the potential of the second pull-down node.

Optionally, the reset circuit includes a first reset transistor, a second reset transistor, and a third reset transistor; a control electrode of the first reset transistor is connected to the pull-up node, and a first electrode of the first reset transistor is connected to the clock signal input end; a control electrode of the second reset transistor is connected to the first pull-down node, a first electrode of the second reset transistor is connected to a second electrode of the first reset transistor, and a second electrode of the second reset transistor is connected to the second voltage end; and a control electrode of the third reset transistor is connected to the second pull-down node, a first electrode of the third reset transistor is connected to the second voltage end, and a second electrode of the third reset transistor is connected to the second electrode of the first reset transistor.

In yet another aspect, the present disclosure further provides a display device including a gate driving circuit, and the gate driving circuit includes a plurality of the above-described shift register units.

DETAILED DESCRIPTION

Technical solutions in the embodiments of the present disclosure will be clearly and completely described below in conjunction with the accompanying drawings in the embodiments of the present disclosure. It is obvious that the described embodiments are only a part of the embodiments of the present disclosure, but not all of the embodiments. Based on the embodiments in the present disclosure, all other embodiments obtained by those of ordinary skill in the art without creative efforts fall within the scope of the present disclosure.

Transistors employed in all embodiments of the present disclosure may be Thin Film Transistors (TFT) or Field Effect Transistors (FET) or other devices with the same characteristics. In the embodiments of the present disclosure, in order to distinguish two electrodes of the transistor other than a control electrode, one of the two electrodes is referred to as a first electrode, and the other of the two electrodes is referred to as a second electrode. In actual operation, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

Figure 1:
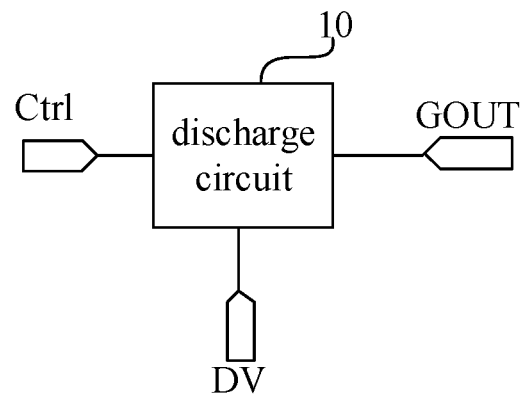
FIG. 1 is a structural diagram of an elimination circuit for eliminating an afterimage existing upon shutting down a display screen according to some embodiments of the present disclosure.

In the embodiments of the present disclosure, an elimination circuit for eliminating an afterimage existing upon shutting down a display screen is applied to a shift register unit. As shown in FIG. 1, the shift register unit includes a gate-driving-signal output end GOUT, and the elimination circuit includes a discharge control end Ctrl, a discharge circuit 10 and a discharge voltage end DV. The discharge circuit 10 is configured to, under control of a signal inputted by the discharge control end Ctrl, control to electrically disconnect the gate-driving-signal output end GOUT from the discharge voltage end DV during a display period of a display screen, and control to electrically connect the gate-driving-signal output end GOUT to the discharge voltage end DV during a shutdown period of the display screen. The discharge voltage end DV is configured to output a discharge voltage during the shutdown period of the display screen.

In a specific implementation, the discharge voltage is a voltage that can fully turn on a gate electrode included in a display panel and a TFT connected to the gate-driving-signal output end, so as to be able to completely release remaining electrical charges in pixels of the display panel during the shutdown period of the display screen, and a problem of display screen afterimage can be solved.

In actual operation, an absolute value of the discharge voltage is greater than or equal to 22V, but the present disclosure is not limited thereto, the value of the discharge voltage can be set according to actual needs.

In the embodiments of the present disclosure, a discharge circuit is arranged in the elimination circuit, and the discharge circuit controls to electrically disconnect the gate-driving-signal output end from the discharge voltage end during the display period of the display screen, so as not to adversely affect an operation of the display screen, and the discharge circuit controls to electrically connect the gate-driving-signal output end to the discharge voltage end during the shutdown period of the display screen, so as to fully release remaining electrical charges in pixels.

In a specific implementation, the discharge control end is configured to receive an ineffective voltage to the discharge circuit during the display period of the display screen, and input an effective voltage to the discharge circuit during the shutdown period of the display screen.

The effective voltage is a voltage that causes the transistor in the discharge circuit to be turned on, and the ineffective voltage is a voltage that causes the transistor in the discharge circuit to be turned off.

For example, when the transistor in the discharge circuit is an N-type transistor, the effective voltage may be a high voltage, and the ineffective voltage may be a low voltage; when the transistor in the discharge circuit is a P-type transistor, the effective voltage may be a low voltage, and the ineffective voltage may be a high voltage.

In actual operation, a pixel circuit connected to the gate-driving-signal output end may include a TFT, wherein the TFT is an N-type transistor, and a voltage value of the discharge voltage is positive; or the TFT is a P-type transistor, and the voltage value of the discharge voltage is negative.

According to a specific embodiment, the discharge circuit may include a discharge transistor; and a gate electrode of the discharge transistor is connected to the discharge control end, a first electrode of the discharge transistor is connected to the discharge voltage end, and a second electrode of the discharge transistor is connected to the gate-driving-signal output end.

According to another specific embodiment, the discharge voltage end includes a first discharge voltage end and a second discharge voltage end; the discharge circuit includes a first discharge transistor and a second discharge transistor; a control electrode of the first discharge transistor is connected to the discharge control end, a first electrode of the first discharge transistor is connected to the first discharge voltage end, and a second electrode of the first discharge transistor is connected to the gate-driving-signal output end; and a control electrode of the second discharge transistor is connected to the discharge control end, a first electrode of the second discharge transistor is connected to the gate-driving-signal output end, and a second electrode of the second discharge transistor is connected to the second discharge voltage end.

According to yet another specific embodiment, the discharge voltage end includes a clock signal input end; the discharge circuit includes a discharge transistor; and a control electrode of the discharge transistor is connected to the discharge control end, a first electrode of the discharge transistor is connected to the clock signal input end, and a second electrode of the discharge transistor is connected to the gate-driving-signal output end.

The elimination circuit of the present disclosure will be described below through some embodiments.

Figure 2:
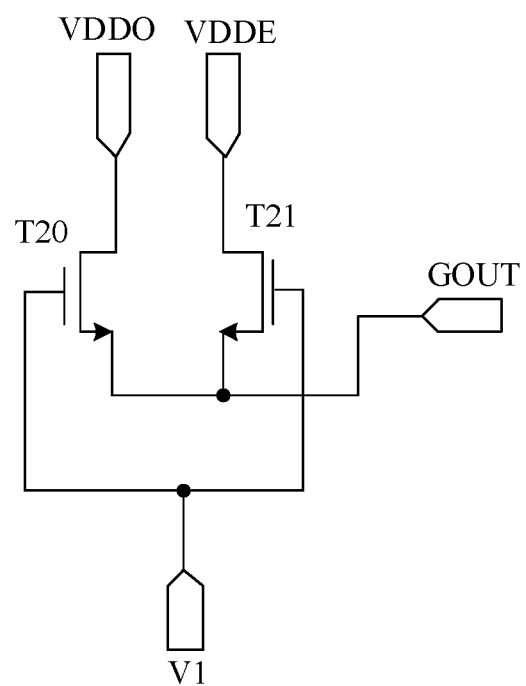
FIG. 2 is a circuit diagram of the elimination circuit according to some embodiments of the present disclosure.

FIG. 2 shows an elimination circuit for eliminating an afterimage existing upon shutting down a display screen according to some embodiments of the present disclosure, which is applied to the shift register unit and includes the discharge circuit; the shift register unit includes the gate-driving-signal output end GOUT, a first voltage end V1, a first control voltage end for inputting a first control voltage VDDO, and a second control voltage end for inputting a second control voltage VDDE. In the elimination circuit shown in FIG. 2, the first voltage end V1 is used as a discharge control end, and the discharge voltage end includes the first control voltage end and the second control voltage end. The discharge circuit includes a first discharge transistor T20 and a second discharge transistor T21; a gate electrode of the first discharge transistor T20 is connected to the first voltage end V1, a drain electrode of the first discharge transistor T20 is connected to the first control voltage end, and a source electrode of the first discharge transistor T20 is connected to the gate-driving-signal output end GOUT; a gate electrode of the second discharge transistor T21 is connected to the first voltage end V1, a drain electrode of the second discharge transistor T21 is connected to the gate-driving-signal output end GOUT, and a source electrode of the second discharge transistor T21 is connected to the second control voltage end. Both the first discharge transistor T20 and the second discharge transistor T21 are N-type transistors, but the present disclosure is not limited thereto.

Figure 3:
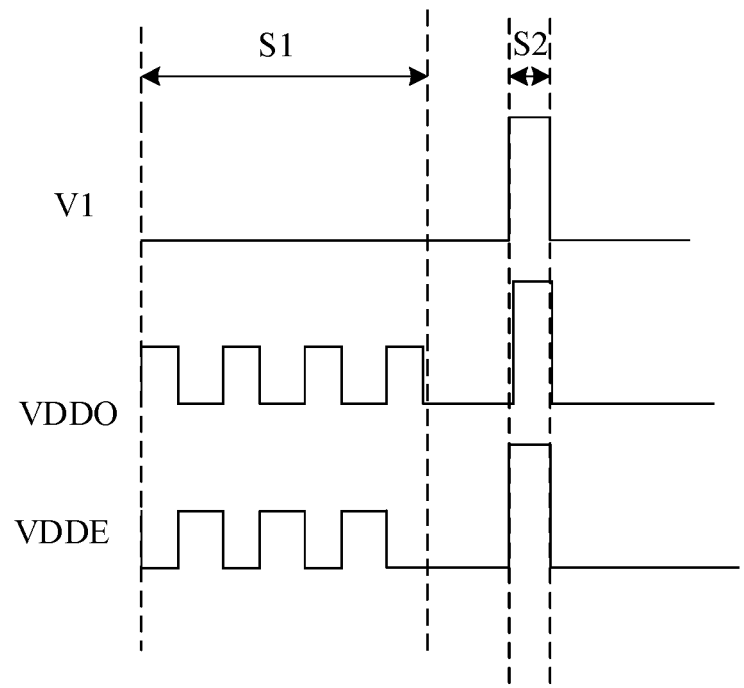
FIG. 3 is a working sequence diagram of the elimination circuit according to some embodiments of the present disclosure.

As shown in FIG. 3, when the elimination circuit shown in FIG. 2 is in operation: during a display period S1 of the display screen, a first voltage inputted by the first voltage end V1 is –5V, and both the first discharge transistor T20 and the second discharge transistor T21 are turned off, so that the operation of the display screen is not adversely affected; during the display period S1, the first control voltage VDDO outputs 12V or 0V, alternately, and the second control voltage VDDE is 0V or 12V, alternately, when the first control voltage VDDO is 12V, the second control voltage VDDE is 0V; and when the second control voltage VDDE is 12V, the first control voltage VDDO is 0V; and during a shutdown period S2 of the display screen, the first voltage inputted by the first voltage end V1 is pulled up to 12V, and both the first discharge transistor T20 and the second discharge transistor T21 are turned on. At this time, both the first control voltage VDDO and the second control voltage VDDE are pulled up to 25V or more, so that a potential of the gate driving signal outputted by the gate-driving-signal output end GOUT is more than 25V when the display screen is shut down, which can completely discharge the remaining electrical charges in the pixel and solve the problem of the shutdown afterimage.

Figure 4:
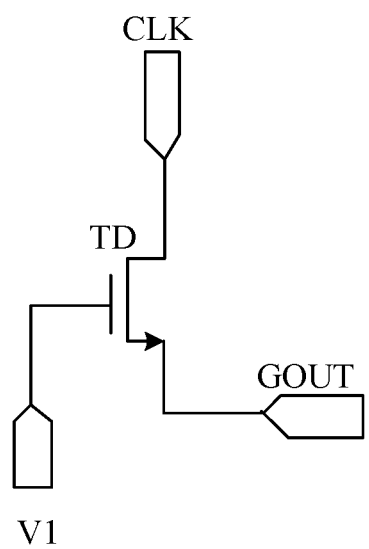
FIG. 4 is a circuit diagram of another elimination circuit according to some embodiments of the present disclosure.

FIG. 4 shows another elimination circuit according to some embodiments of the present disclosure, which is applied to the shift register unit, and includes the discharge circuit. The shift register unit includes the gate-driving-signal output end GOUT, the first voltage end V1, and a clock signal input end for inputting a clock signal CLK. In the elimination circuit shown in FIG. 4, the first voltage end V1 is used as the discharge control end, and the clock signal input end is used as the discharge voltage end. The discharge circuit includes a discharge transistor TD; a gate electrode of the discharge transistor TD is connected to the first voltage end V1, a drain electrode of the discharge transistor TD is connected to the clock signal input end CLK, and a source electrode of the discharge transistor TD is connected to the gate-driving-signal output end GOUT. The discharge transistor TD is the N-type transistor, but the present disclosure is not limited thereto.

Figure 10:
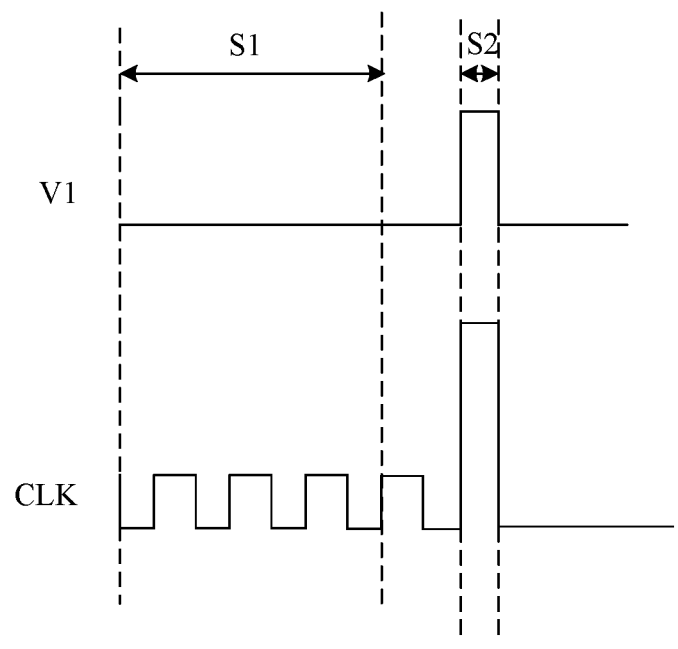
FIG. 10 is a working sequence diagram of the elimination circuit shown in FIG. 4 according to some embodiments of the present disclosure.

As shown in the sequence diagram of FIG. 10, when the elimination circuit shown in FIG. 4 is in operation: during the display period S1, the first voltage inputted to the first voltage end V1 is –5V, and the discharge transistor TD is turned off, so that the operation of the display screen is not adversely affected, it is in high level or low level alternately in a CLK interval; and during the shutdown period S2, the first voltage inputted by the first voltage end V1 is pulled up to 12V, and the discharge transistor TD is turned on. At this time, the clock signal CLK is pulled up to 25V or more, so that the potential of the gate driving signal outputted by the gate-driving-signal output end GOUT is 25V or more when the display screen is shut down, which can completely release the remaining electrical charges in the pixel, and solve a problem of the display screen shutdown afterimage.

The shift register unit according to the embodiments of the present disclosure includes the above-described elimination circuit.

Specifically, the shift register unit of the present disclosure may further include the gate-driving-signal output end, a pull-up node control circuit, a pull-down node control circuit, an output circuit, and an output reset circuit; wherein the output reset circuit is connected to a pull-down node, the gate-driving-signal output end, and a first voltage end, and is configured to control to electrically connect the gate-driving-signal output end to the first voltage end under control of a potential of the pull-down node; the pull-up node control circuit is connected to an input end, an initial reset end, a pull-up node, a pull-down node, a pull-up reset end, and a second voltage end, and is configured to control a potential of the pull-up node under control of an input signal, the potential of the pull-down node, and a pull-up reset signal, wherein the input end is configured to receive the input signal, the initial reset end is configured to receive the initial reset signal, and the pull-up reset end is configured to receive the pull-up reset signal; the pull-down node control circuit is connected to a first power voltage end, the pull-up node, the pull-down node and the second voltage end, and is configured to control the potential of the pull-down node under control of the potential of the pull-up node; the output circuit is connected to the pull-up node, the gate-driving-signal output end, and a clock signal input end, and is configured to control to electrically connect the gate-driving-signal output end to the clock signal input end under the control of the potential of the pull-up node; and the discharge control end of the elimination circuit includes the first voltage end, and the discharge voltage end of the elimination circuit includes the first power voltage end or the clock signal input end.

In a specific implementation, when the elimination circuit includes a discharge circuit that is the N-type transistor, a low voltage may be inputted to the first voltage end during the display period of the display screen. The first voltage inputted by the first voltage end is pulled up to a high voltage during the shutdown period of the display screen, and the first power voltage end may be a high voltage end, but the present disclosure is not limited thereto.

In actual operation, the second voltage end may be a low level end, but the present disclosure is not limited thereto.

Figure 5:
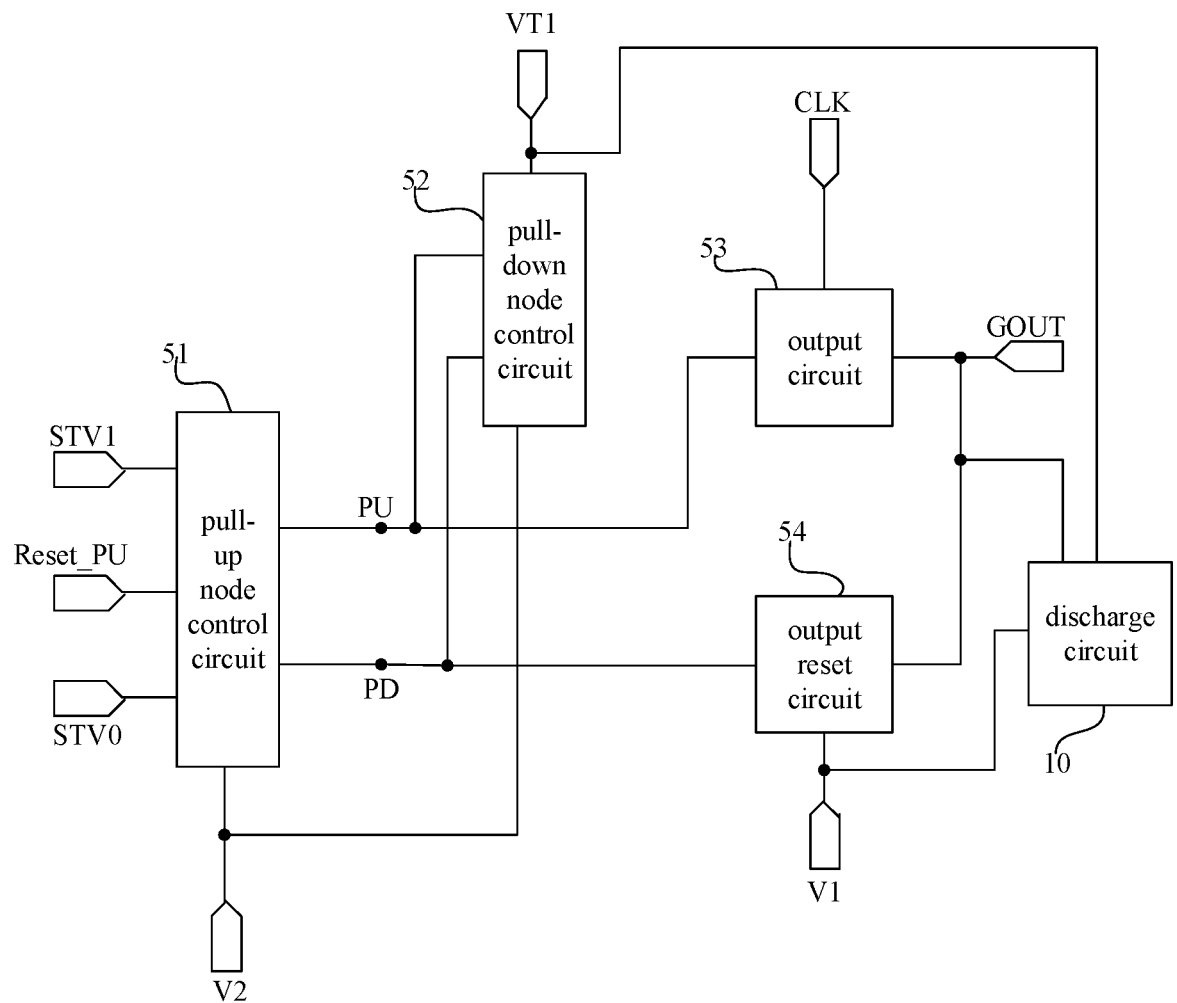
FIG. 5 is a structural diagram of a shift register unit according to some embodiments of the present disclosure.

As shown in FIG. 5, a shift register according to some embodiments of the present disclosure includes an elimination circuit for eliminating an afterimage existing upon shutting down a display screen, a gate-driving-signal output end GOUT, a pull-up node control circuit 51, a pull-down node control circuit 52, an output circuit 53 and an output reset circuit 54; the elimination circuit includes the discharge control end, the discharge circuit 10 and the discharge voltage end; the output reset circuit 54 is connected to a pull-down node PD, the gate-driving-signal output end GOUT, and a first voltage end V1, and is configured to control to electrically connect the gate-driving-signal output end GOUT to the first voltage end V1 under control of a potential of the pull-down node PD; the pull-up node control circuit 51 is connected to an input end STV1, an initial reset end STV0, a pull-up node PU, a pull-down node PD, a pull-up reset end Reset_PU, and a second voltage end V2, and is configured to control a potential of a pull-up node PU under control of an input signal, an initial reset signal, the potential of the pull-down node PD, and a pull-up reset signal, wherein the input end STV1 is configured to receive the input signal, the initial reset end STV0 is configured to receive the initial reset signal, and the pull-up reset end Reset_PU is configured to receive the pull-up reset signal; the pull-down node control circuit 52 is connected to a first power voltage end VT1, the pull-up node PU, the pull-down node PD and the second voltage end V2, and is configured to control the potential of the pull-down node PD under control of the potential of the pull-up node PU; the output circuit 53 is connected to the pull-up node PU, the gate-driving-signal output end GOUT, and a clock signal input end, and is configured to control to electrically connect the gate-driving-signal output end GOUT to the clock signal input end under the control of the potential of the pull-up node PU; the clock signal input end is configured to receive the clock signal CLK; the first voltage end V1 is reused as the discharge control end, and a first power voltage end VT1 is reused as the discharge voltage end; and the discharge circuit 10 is configured to, under the control of the signal inputted by the first voltage end V1, control to electrically disconnect the gate-driving-signal output end GOUT from the first power supply voltage end VT1 during the display period of the display screen, and control to electrically connect the gate-driving-signal output end GOUT to the first power supply voltage end VT1 during the shutdown period of the display screen.

In actual operation, the second voltage end may be a low level end, but the present disclosure is not limited thereto.

When the shift register unit shown in FIG. 5 is in operation, when the discharge circuit 10 includes a discharge transistor which is an N-type transistor, and a TFT included in the pixel circuit in the display panel is also an N-type transistor, a low voltage may be inputted to the first voltage end V1 during the display period of the display screen, so that the discharge transistor is turned off, thereby not adversely affecting the operation of the display screen. In addition, the first voltage inputted by the first voltage end V1 is pulled up to a high voltage during the shutdown period of the display screen, thereby causing the discharge transistor to be turned on, so that the gate-driving-signal output end GOUT and the first power voltage end VT1 are electrically connected, and the first power supply voltage inputted by the first power voltage end VT1 is pulled up to 25V or more, so that the potential of the gate driving signal outputted by the gate-driving-signal output end GOUT is 25V or more, and the remaining electrical charges in the pixel can be sufficiently released.

In a specific implementation, the clock signal input end can also be reused as the discharge voltage end.

Figure 6:
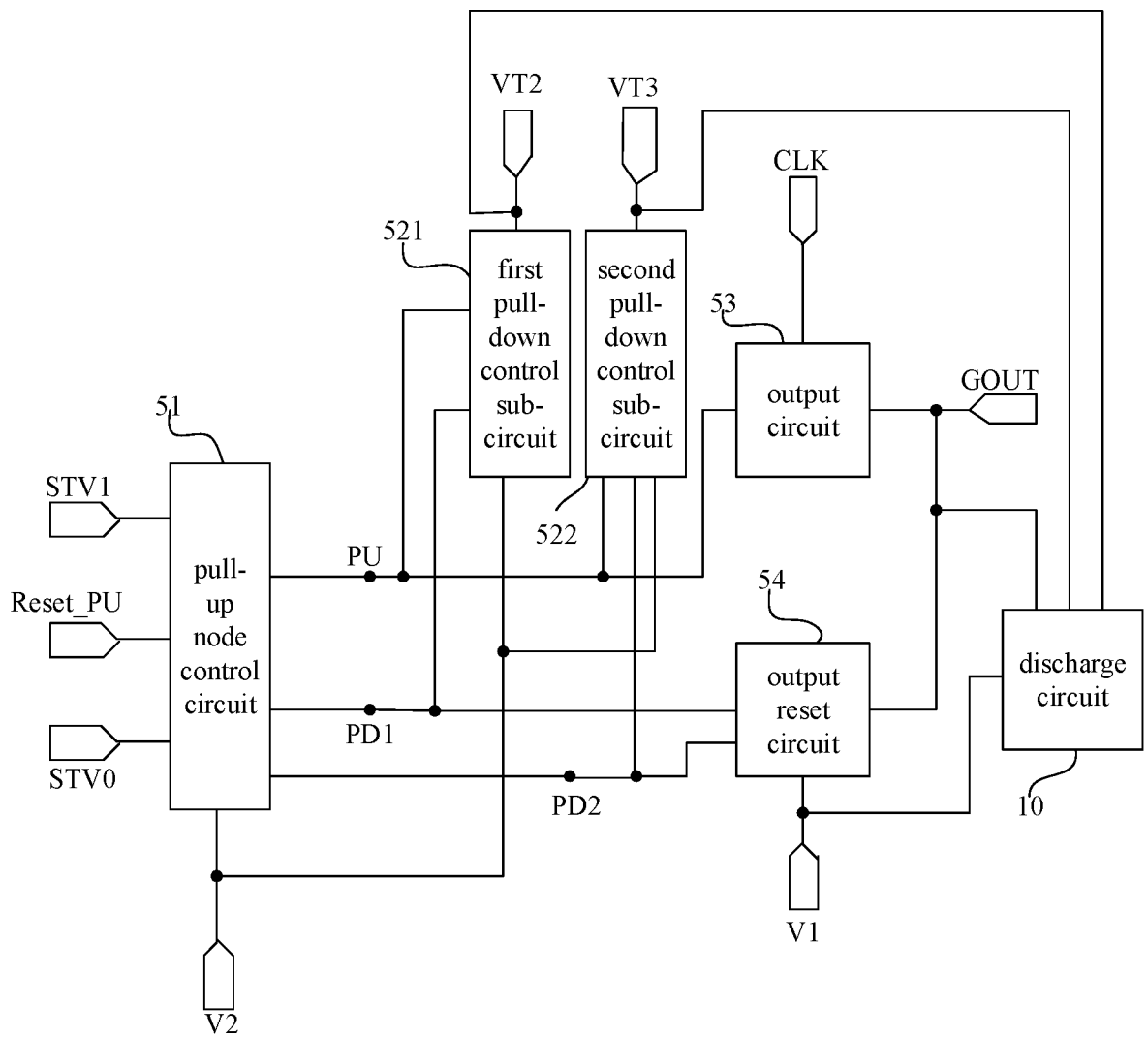
FIG. 6 is a circuit diagram of another shift register unit according to some embodiments of the present disclosure.

Specifically, in some embodiments of the present disclosure, on the basis of the shift register unit shown in FIG. 5, as shown in FIG. 6, the pull-down node control circuit 52 may include a first pull-down control sub-circuit 521 and a second pull-down control sub-circuit 522, the first power voltage end may include a second power voltage end VT2 and a third power voltage end VT3; and the pull-down node includes a first pull-down node PD1 and a second pull-down node PD2; the first pull-down control sub-circuit 521 is connected to the first pull-down node PD1, the pull-up node PU, the second power voltage end VT2, and the second voltage end V2, and is configured to control a potential of the first pull-down node PD1 under the control of the potential of the pull-up node PU; and the second pull-down control sub-circuit 522 is connected to the second pull-down node PD2, the pull-up node PU, the third power voltage end VT3, and the second voltage end V2, and is configured to control a potential of the second pull-down node PD2 under the control of the potential of the pull-up node PU. The discharge circuit 10 is connected to the second power voltage end VT2, the third power voltage end VT3, the first voltage end V1 and the gate-driving-signal output end GOUT, and is configured to connect the gate-driving-signal output end GOUT to the second power voltage end VT2 under the control of the first power end V1 during the shutdown period of the display screen, and connect the gate-driving-signal output end GOUT to the third power supply voltage end VT3.

In a specific implementation, the first pull-down control sub-circuit may include a first pull-down control transistor, a second pull-down control transistor, a third pull-down control transistor, and a fourth pull-down control transistor; a control electrode of the first pull-down control transistor and a first electrode of the first pull-down control transistor are both connected to the second power voltage end; a control electrode of the second pull-down control transistor is connected to the pull-up node, a first electrode of the second pull-down control transistor is connected to the second voltage end, and a second electrode of the second pull-down control transistor is connected to a second electrode of the first pull-down control transistor; a control electrode of the third pull-down control transistor is connected to the second electrode of the first pull-down control transistor, and a first electrode of the third pull-down control transistor is connected to the second power voltage end; and a control electrode of the fourth pull-down control transistor is connected to the pull-up node, a first electrode of the fourth pull-down control transistor is connected to a second electrode of the third pull-down control transistor, and a second electrode of the fourth pull-down control transistor is connected to the second voltage end.

In a specific implementation, the second pull-down control sub-circuit may include a fifth pull-down control transistor, a sixth pull-down control transistor, a seventh pull-down control transistor, and an eighth pull-down control transistor; a control electrode of the fifth pull-down control transistor and a first electrode of the fifth pull-down control transistor are both connected to the third power voltage end; a control electrode of the sixth pull-down control transistor is connected to the pull-up node, a first electrode of the sixth pull-down control transistor is connected to the second voltage end, and a second electrode of the sixth pull-down control transistor is connected to a second electrode of the fifth pull-down control transistor; a control electrode of the seventh pull-down control transistor is connected to the second electrode of the fifth pull-down control transistor, and a first electrode of the seventh pull-down control transistor is connected to the third power voltage end; and a control electrode of the eighth pull-down control transistor is connected to the pull-up node, a first electrode of the eighth pull-down control transistor is connected to a second electrode of the seventh pull-down control transistor, and a second electrode of the eighth pull-down control transistor is connected to the second voltage end.

In a specific implementation, the output reset circuit may include a first output reset transistor and a second output reset transistor; a control electrode of the first output reset transistor is connected to the first pull-down node, a first electrode of the first output reset transistor is connected to the gate-driving-signal output end, and a second electrode of the first output reset transistor is connected to the first voltage end; and a control electrode of the second output reset transistor is connected to the second pull-down node, a first electrode of the second output reset transistor is connected to the first voltage end, and a second electrode of the second output reset transistor is connected to the gate-driving-signal output end.

In a specific implementation, the output circuit may include an output transistor and a storage capacitor; a control electrode of the output transistor is connected to the pull-up node, a first electrode of the output transistor is connected to the clock signal input end, and a second electrode of the output transistor is connected to the gate-driving-signal output end.

In a specific implementation, the pull-up node control circuit may include a first pull-up control transistor, a second pull-up control transistor, a third pull-up control transistor, a fourth pull-up control transistor, and a fifth pull-up control transistor; a control electrode of the first pull-up control transistor and a first electrode of the first pull-up control transistor are both connected to the input end, and a second electrode of the first pull-up control transistor is connected to the pull-up node; a control electrode of the second pull-up control transistor is connected to the initial reset end, a first electrode of the second pull-up control transistor is connected to the pull-up node, and a second electrode of the second pull-up control transistor is connected to the second voltage end; a control electrode of the third pull-up control transistor is connected to a first pull-down node, a first electrode of the third pull-up control transistor is connected to the second voltage end, and a second electrode of the third pull-up control transistor is connected to the pull-up node; a control electrode of the fourth pull-up control transistor is connected to a second pull-down node, a first electrode of the fourth pull-up control transistor is connected to the pull-up node, and a second electrode of the fourth pull-up control transistor is connected to the second voltage end; and a control electrode of the fifth pull-up control transistor is connected to the pull-up reset end, a first electrode of the fifth pull-up control transistor is connected to the pull-up node, and a second electrode of the fifth pull-up control transistor is connected to the second voltage end.

In actual operation, the shift register unit according to the embodiments of the present disclosure may further include a reset circuit; the reset circuit is connected to the pull-up node, the first pull-down node, the second pull-down node, the first power voltage end and the clock signal input end, and is configured to control to electrically connect the clock signal input end to the second voltage end under control of the potential of the pull-up node, the potential of the first pull-down node, and the potential of the second pull-down node.

Specifically, the reset circuit may include a first reset transistor, a second reset transistor, and a third reset transistor; a control electrode of the first reset transistor is connected to the pull-up node, and a first electrode of the first reset transistor is connected to the clock signal input end; a control electrode of the second reset transistor is connected to the first pull-down node, a first electrode of the second reset transistor is connected to a second electrode of the first reset transistor, and a second electrode of the second reset transistor is connected to the second voltage end; and a control electrode of the third reset transistor is connected to the second pull-down node, a first electrode of the third reset transistor is connected to the second voltage end, and a second electrode of the third reset transistor is connected to the second electrode of the first reset transistor.

Figure 7:
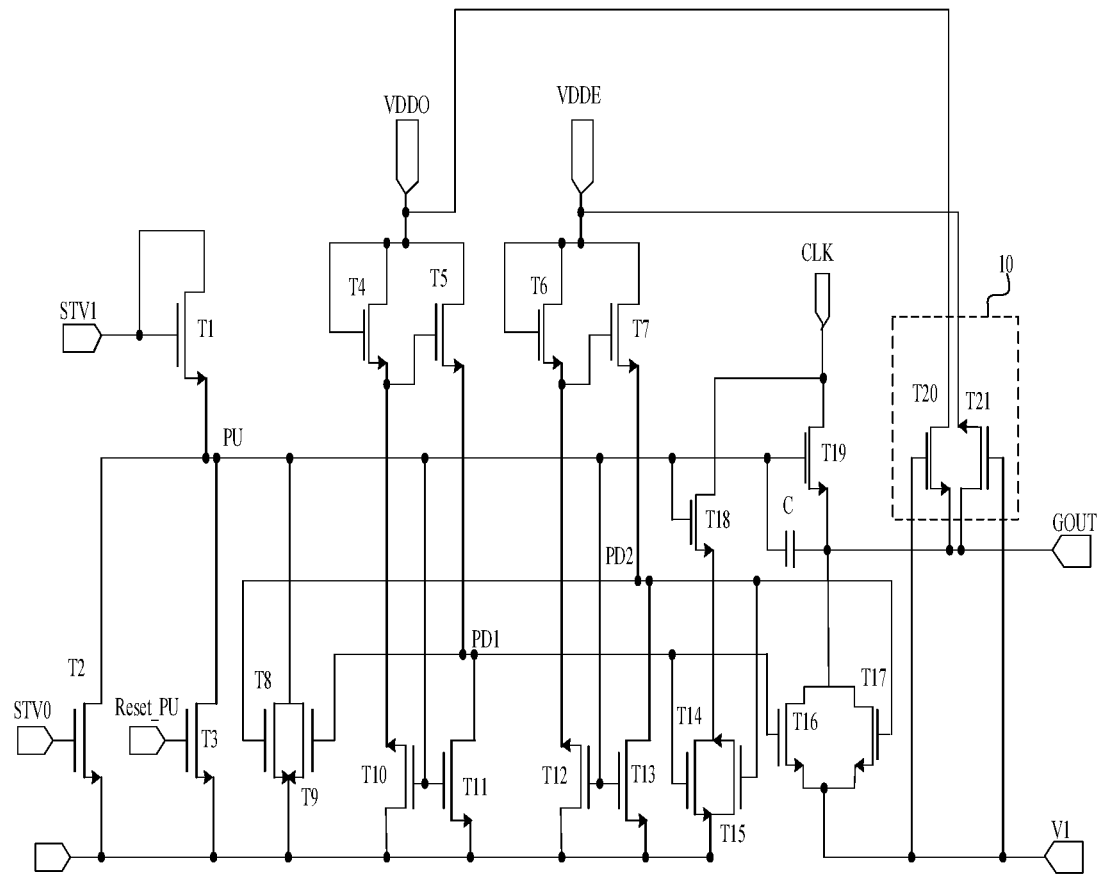
FIG. 7 is a circuit diagram of yet another shift register unit according to some embodiments of the present disclosure.

As shown in FIG. 7, yet another shift register unit according to some embodiments of the present disclosure includes an elimination circuit for eliminating an afterimage existing upon shutting down a display screen, a gate-driving-signal output end GOUT, a pull-up node control circuit, a pull-down node control circuit, output circuit, output reset circuit and reset circuit; the elimination circuit includes the discharge control end, the discharge circuit 10 and the discharge voltage end; the pull-down node control circuit includes a first pull-down control sub-circuit and a second pull-down control sub-circuit; the first pull-down control sub-circuit includes a first pull-down control transistor T4, a second pull-down control transistor T10, a third pull-down control transistor T5, and a fourth pull-down control transistor T11; a gate electrode of the first pull-down control transistor T4 and a drain electrode of the first pull-down control transistor T4 are connected to the first control voltage end; and the first control voltage end is configured to receive the first control voltage VDDO; a gate electrode of the second pull-down control transistor T10 is connected to the pull-up node PU, a drain electrode of the second pull-down control transistor T10 is connected to a low level end, and a source electrode of the second pull-down control transistor T10 is connected to a source electrode of the first pull-down control transistor T4; a gate electrode of the third pull-down control transistor T5 is connected to a source electrode of the first pull-down control transistor T4, and a drain electrode of the third pull-down control transistor T5 is connected to the first control voltage end; a gate electrode of the fourth pull-down control transistor T6 is connected to the pull-up node PU, a drain electrode of the fourth pull-down control transistor T6 is connected to a source electrode of the third pull-down control transistor T5, and a source electrode of the fourth pull-down control transistor T6 is connected to the low level end; the low level end is used to input a low level VS S.

The second pull-down control sub-circuit includes a fifth pull-down control transistor T6, a sixth pull-down control transistor T12, a seventh pull-down control transistor T7, and an eighth pull-down control transistor T13; a gate electrode of the fifth pull-down control transistor T6 and a drain electrode of the fifth pull-down control transistor T6 are both connected to the second control voltage end; and the second control voltage end is configured to receive the second control voltage VDDE; a gate electrode of the sixth pull-down control transistor T12 is connected to the pull-up node PU, a drain electrode of the sixth pull-down control transistor T12 is connected to the low level end, and a source electrode of the sixth pull-down control transistor T12 is connected to a source electrode of the fifth pull-down control transistor T6; a gate electrode of the seventh pull-down control transistor T7 is connected to a source electrode of the fifth pull-down control transistor T7, and a drain electrode of the seventh pull-down control transistor T7 is connected to the second control voltage end; a gate electrode of the eighth pull-down control transistor T13 is connected to the pull-up node PU, and a drain electrode of the eighth pull-down control transistor T13 is connected to a source electrode of the seventh pull-down control transistor T7, and a source electrode of the eighth pull-down control transistor T13 is connected to the low level end.

The output reset circuit includes a first output reset transistor T16 and a second output reset transistor T17; a gate electrode of the first output reset transistor T16 is connected to the first pull-down node PD1, and a drain electrode of the first output reset transistor T16 is connected to the gate-driving-signal output end GOUT, a source electrode of the first output reset transistor T6 is connected to the first voltage end V1; a gate electrode of the second output reset transistor T17 is connected to the second pull-down node PD2, a drain electrode of the second output reset transistor T17 is connected to the first voltage end V1, and a source electrode of the second output reset transistor T17 is connected to the gate-driving-signal output end GOUT.

The output circuit includes an output transistor T19 and a storage capacitor C; a gate electrode of the output transistor T19 is connected to the pull-up node PU, a drain electrode of the output transistor T19 is connected to the clock signal input end, and a source electrode of the output transistor T19 is connected to the gate-driving-signal output end GOUT; the clock signal input is configured to receive the clock signal CLK; a first end of the storage capacitor C is connected to the pull-up node PU, and the second end of the storage capacitor C is connected to the gate-driving-signal output end GOUT.

The pull-up node control circuit includes a first pull-up control transistor T1, a second pull-up control transistor T2, a third pull-up control transistor T9, a fourth pull-up control transistor T8, and a fifth pull-up control transistor T3; a gate electrode of a first pull-up control transistor T1 and a drain electrode of the first pull-up control transistor T1 are connected to the input end STV1, and a source electrode of the first pull-up control transistor T1 is connected to the pull-up node PU; a gate electrode of the second pull-up control transistor T2 is connected to the initial reset end STV0, a drain electrode of the second pull-up control transistor T2 is connected to the pull-up node PU, and a source electrode of the second pull-up control transistor T2 is connected to the low level end; a gate electrode of the third pull-up control transistor T9 is connected to the first pull-down node PD1, a drain electrode of the third pull-up control transistor T9 is connected to the low level end, and a source electrode of the third pull-up control transistor T9 is connected to the pull-up node PU; a gate electrode of the fourth pull-up control transistor T8 is connected to the second pull-down node PD2, a drain electrode of the fourth pull-up control transistor T8 is connected to the pull-up node PU, and a source electrode of the fourth pull-up control transistor T8 is connected to the low level end; a gate electrode of the fifth pull-up control transistor T3 is connected to the pull-up reset end Reset_PU, a drain electrode of the fifth pull-up control transistor T3 is connected to the pull-up node PU, and a source electrode of the fifth pull-up control transistor T3 is connected to the low level end.

The reset circuit includes a first reset transistor T18, a second reset transistor T14, and a third reset transistor T15; a gate electrode of the first reset transistor T18 is connected to the pull-up node PU, and a drain electrode of the first reset transistor T18 is connected to the clock signal input end; a gate electrode of the second reset transistor T14 is connected to the first pull-down node PD1, a drain electrode of the second reset transistor T14 is connected to a source electrode of the first reset transistor T18, and a source electrode of the second reset transistor T14 is connected to the low level end; a gate electrode of the third reset transistor T15 is connected to the second pull-down node PD2, a drain electrode of the third reset transistor is connected to the low level end, a source electrode of the third reset transistor T15 is connected to a source electrode of the first reset transistor T18.

The discharge circuit 10 includes a first discharge transistor T20 and a second discharge transistor T21; a gate electrode of the first discharge transistor T20 is connected to the first voltage end V1, a drain electrode of the first discharge transistor T20 is connected to the first control voltage end, and a source electrode of the first discharge transistor T20 is connected to the gate-driving-signal output end GOUT; and a gate electrode of the second discharge transistor T21 is connected to the first voltage end V1, a drain electrode of the second discharge transistor T21 is connected to the gate-driving-signal output end GOUT, and a source electrode of the second discharge transistor T21 is connected to the second control voltage end.

In the shift register unit shown in FIG. 7, all of the transistors are N-type transistors, but the present disclosure is not limited thereto.

In the shift register unit shown in FIG. 7, the first power voltage end includes a second power voltage end and a third power voltage end, and the second power voltage end is a first control voltage end, and the third power voltage end is a second control voltage end, the first voltage end V1 is reused as a discharge control end, and the second voltage end is a low level end of the input low level VSS.

When the shift register unit shown in FIG. 7 is in operation: during the display period of the display screen, a low voltage VGL is inputted to the first voltage end V1, and the VGL may be −5V, but the present disclosure is not limit thereto; during the shutdown period of the display screen, the first voltage inputted by the first voltage end V1 is pulled up to 12V or more, and the first control voltage VDDO and the second control voltage VDDE are pulled up to 25V or more, so that both the first discharge transistor T20 and the second discharge transistor T21 are turned on, a potential of the gate driving signal outputted from the gate-driving-signal output end GOUT is 25V or more, which ensures that a turn-on voltage of the gate electrode of the TFT in an effective display region of the display panel is sufficiently large, so that the charge residue in the pixel can be completely released, and the afterimage problem is solved.

Figure 8:
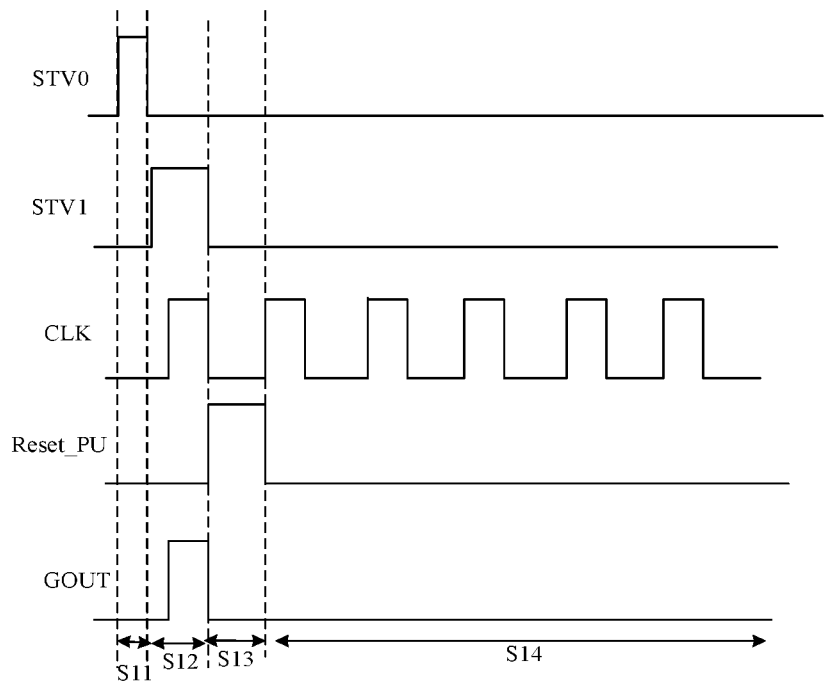
FIG. 8 is a working sequence diagram of still yet another shift register unit during a display period of the display screen according to some embodiments of the present disclosure.

When the shift register unit shown in FIG. 7 in the present disclosure is in operation, during the display period of the display screen, as shown in FIG. 8: during an initial stage S11 included in the display period of the display screen, a high level is inputted to the initial reset end STV0, a low voltage VGL is inputted to the first voltage end V1, the second pull-up control transistor T2 is turned on, a potential of the pull-up node PU is pulled up, and the output transistor T19 is turned on. Since the clock signal CLK is at a low level at this time, the gate-driving-signal output end GOUT outputs low level; during the initial stage S11, since a potential of the pull-up node PU is high level, both the second pull-down control transistor T10 and the fourth pull-down control transistor T11 are turned on to reduce the potential of the first pull-down node PD1, and both the sixth pull-down control transistor T12 and the eighth pull-down control transistor T13 are turned on to reduce the potential of the second pull-down node PD2; during an input stage S12 included in the display period of the display screen, a high level is inputted to the input end STV1, a low voltage VGL is inputted to the first voltage end V1, the first pull-up control transistor T1 is turned on, the potential of the pull-up node PU is pulled up, the potential of the first pull-down node PD1 and the potential of the second pull-down node PD2 are both pulled down, the first output reset transistor T16 and the second output reset transistor T17 are turned off, the output transistor T19 is turned on, the clock signal CLK is high level, and the gate-driving-signal output end GOUT outputs high level; at S12, since the potential of the pull-up node PU is high level, the second pull-down control transistor T10 and the fourth pull-down control transistor T11 are both turned on to reduce the potential of the first pull-down node PD1, and both the sixth pull-down control transistor T12 and the eighth pull-down control transistor T13 are turned on, to reduce the potential of the second pull-down node PD2; during a reset phase S13 included in the display period of the display screen, a high level is inputted to the pull-up reset end Reset_PU to reduce the potential of the pull-up node PU, so that the output transistor T19 is turned off, and at this time, the first control voltage VDDO is a high voltage, and the second control voltage VDDE is a low voltage, so that the potential of the first pull-down node PD1 is high voltage, the potential of the second pull-down node PD2 is low voltage, the first output reset transistor T16 is turned on, and a low voltage VGL is inputted to the first voltage end V1, so that the gate-driving-signal output end GOUT outputs low voltage VGL; and during an output terminating and holding phase S14 in the display period of the display screen, the low voltage VGL is inputted to the first voltage end V1, the second control voltage VDDE is high voltage or low voltage in an alternate manner, the first control voltage VDDO is low voltage or high voltage in an alternate manner, potential of the second pull-down node PD2 and potential of the first pull-down node PD1 are high level in an alternate manner, the second output reset transistor T17 and the first output reset transistor T16 are turned on in an alternate manner, so that the gate-driving-signal output end GOUT outputs low level VGL, and the fourth pull-up control transistor T8 and the third pull-up control transistor T9 are turned on in an alternate manner, so that the potential of the pull-up node PU is low level.

Figure 9:
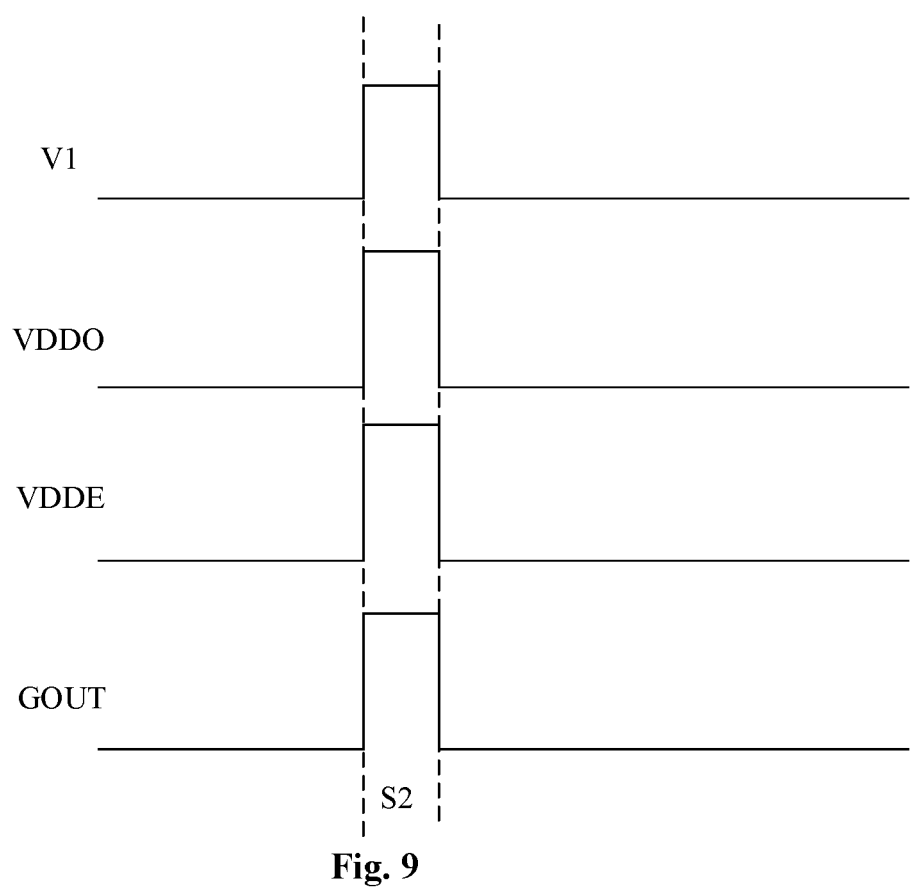
FIG. 9 is a working sequence diagram of still yet another shift register unit during a shutdown period of the display screen, according to some embodiments of the present disclosure.

When the shift register unit shown in FIG. 7 is in operation, during the display period of the display screen, as shown in FIG. 9: during the shutdown period S2 of the display screen, the first voltage inputted by the first voltage end V1 is pulled up to 12V, the first control voltage VDDO and the second control voltage VDDE are pulled up to 25V or more, and both the first discharge transistor T20 and the second discharge transistor T21 are turned on, so that the potential of the gate driving signal outputted by the gate-driving-signal output end GOUT is 25V or more.

In actual operation, during the shutdown period S2, a potential of the clock signal CLK is also pulled up to 25V or more. Therefore, in the embodiment of the present disclosure, the clock signal input end may also be reused as the discharge voltage end.

When the clock signal input end functions as the discharge voltage end, the display screen afterimage can be eliminated by using only one discharge transistor, and a load of a clock signal line is small.

The display device according to the embodiments of the present disclosure includes the above-described gate driving circuit; the gate driving circuit includes a plurality of the above-described shift register units.

The display device may be any products or parts that have a display function, for example, an electronic paper, an Organic Light-Emitting Diode (OLED) display device, a mobile phone, a tablet computer, a television, a display, a notebook computer, a digital frame, a navigation device, or the like.

The above are merely preferred embodiments of the present disclosure, and it should be noted that those skilled in the art can make various improvements and modifications without departing from principles of the present disclosure, and these improvements and modifications should also be considered as falling into the protection scope of the present disclosure.

What is claimed is:

1. A shift register unit comprising a voltage control circuit, the shift register unit comprising a gate-driving-signal output end, and the voltage control circuit comprising a discharge control end, a discharge circuit and a discharge voltage end; wherein
    the discharge circuit is configured to, under control of a signal inputted by the discharge control end, control to electrically disconnect the gate-driving-signal output end from the discharge voltage end during a display period of a display screen, and control to electrically connect the gate-driving-signal output end to the discharge voltage end during a shutdown period of the display screen,
    wherein the shift register unit further comprises the gate-driving-signal output end, a pull-up node control circuit, a pull-down node control circuit, an output circuit, and an output reset circuit; wherein
    the output reset circuit is connected to a pull-down node, the gate-driving-signal output end, and a first voltage end, and is configured to control to electrically connect the gate-driving-signal output end to the first voltage end under control of a potential of the pull-down node;
    the pull-up node control circuit is connected to an input end, an initial reset end, a pull-up node, a pull-down node, a pull-up reset end, and a second voltage end, and is configured to control a potential of the pull-up node under control of an input signal, an initial reset signal, the potential of the pull-down node, and a pull-up reset signal, wherein the input end is configured to receive the input signal, the initial reset end is configured to receive the initial reset signal, and the pull-up reset end is configured to receive the pull-up reset signal;
    the pull-down node control circuit is connected to a first power voltage end, the pull-up node, the pull-down node and the second voltage end, and is configured to control the potential of the pull-down node under control of the potential of the pull-up node;
    the output circuit is connected to the pull-up node, the gate-driving-signal output end, and a clock signal input end, and is configured to control to electrically connect the gate-driving-signal output end to the clock signal input end under the control of the potential of the pull-up node; and
    the discharge control end of the voltage control circuit comprises the first voltage end, and the discharge voltage end of the voltage control circuit comprises the first power voltage end or the clock signal input end.

2. The shift register unit according to claim 1, wherein the discharge voltage end is configured to output a discharge voltage during the shutdown period of the display screen.

3. The shift register unit according to claim 2, wherein a pixel circuit connected to the gate-driving-signal output end comprises a Thin Film Transistor (TFT), wherein
    the TFT is an N-type transistor, and a voltage value of the discharge voltage is positive; or the TFT is a P-type transistor, and the voltage value of the discharge voltage is negative.

4. The shift register unit according to claim 2, wherein an absolute value of the discharge voltage is greater than or equal to 22V.

5. The shift register unit according to claim 2, wherein the voltage control circuit is configured to eliminate afterimage existing during the shutdown period of the display screen.

6. The shift register unit according to claim 1, wherein the discharge circuit comprises a discharge transistor; and
a gate electrode of the discharge transistor is connected to the discharge control end, a first electrode of the discharge transistor is connected to the discharge voltage end, and a second electrode of the discharge transistor is connected to the gate-driving-signal output end.

7. The shift register unit according to claim 1, wherein the discharge voltage end comprises a first discharge voltage end and a second discharge voltage end;
the discharge circuit comprises a first discharge transistor and a second discharge transistor;
a control electrode of the first discharge transistor is connected to the discharge control end, a first electrode of the first discharge transistor is connected to the first discharge voltage end, and a second electrode of the first discharge transistor is connected to the gate-driving-signal output end; and
a control electrode of the second discharge transistor is connected to the discharge control end, a first electrode of the second discharge transistor is connected to the gate-driving-signal output end, and a second electrode of the second discharge transistor is connected to the second discharge voltage end.

8. The shift register unit according to claim 1, wherein the discharge voltage end comprises a clock signal input end;
the discharge circuit comprises a discharge transistor; and
a control electrode of the discharge transistor is connected to the discharge control end, a first electrode of the discharge transistor is connected to the clock signal input end, and a second electrode of the discharge transistor is connected to the gate-driving-signal output end.

9. The shift register unit according to claim 1, wherein the pull-down node control circuit comprises a first pull-down control sub-circuit and a second pull-down control sub-circuit, the first power voltage end comprises a second power voltage end and a third power voltage end; and the pull-down node comprises a first pull-down node and a second pull-down node;
the first pull-down control sub-circuit is connected to the first pull-down node, the pull-up node, the second power voltage end, and the second voltage end, and is configured to control a potential of the first pull-down node under the control of the potential of the pull-up node; and
the second pull-down control sub-circuit is connected to the second pull-down node, the pull-up node, the third power voltage end, and the second voltage end, and is configured to control a potential of the second pull-down node under the control of the potential of the pull-up node.

10. The shift register unit according to claim 9, wherein the first pull-down control sub-circuit comprises a first pull-down control transistor, a second pull-down control transistor, a third pull-down control transistor, and a fourth pull-down control transistor;

a control electrode of the first pull-down control transistor and a first electrode of the first pull-down control transistor are both connected to the second power voltage end;
a control electrode of the second pull-down control transistor is connected to the pull-up node, a first electrode of the second pull-down control transistor is connected to the second voltage end, and a second electrode of the second pull-down control transistor is connected to a second electrode of the first pull-down control transistor;
a control electrode of the third pull-down control transistor is connected to the second electrode of the first pull-down control transistor, and a first electrode of the third pull-down control transistor is connected to the second power voltage end; and
a control electrode of the fourth pull-down control transistor is connected to the pull-up node, a first electrode of the fourth pull-down control transistor is connected to a second electrode of the third pull-down control transistor, and a second electrode of the fourth pull-down control transistor is connected to the second voltage end.

11. The shift register unit according to claim 9, wherein the second pull-down control sub-circuit comprises a fifth pull-down control transistor, a sixth pull-down control transistor, a seventh pull-down control transistor, and an eighth pull-down control transistor;
a control electrode of the fifth pull-down control transistor and a first electrode of the fifth pull-down control transistor are both connected to the third power voltage end;
a control electrode of the sixth pull-down control transistor is connected to the pull-up node, a first electrode of the sixth pull-down control transistor is connected to the second voltage end, and a second electrode of the sixth pull-down control transistor is connected to a second electrode of the fifth pull-down control transistor;
a control electrode of the seventh pull-down control transistor is connected to the second electrode of the fifth pull-down control transistor, and a first electrode of the seventh pull-down control transistor is connected to the third power voltage end; and
a control electrode of the eighth pull-down control transistor is connected to the pull-up node, a first electrode of the eighth pull-down control transistor is connected to a second electrode of the seventh pull-down control transistor, and a second electrode of the eighth pull-down control transistor is connected to the second voltage end.

12. The shift register unit according to claim 9, wherein the output reset circuit comprises a first output reset transistor and a second output reset transistor;
a control electrode of the first output reset transistor is connected to the first pull-down node, a first electrode of the first output reset transistor is connected to the gate-driving-signal output end, and a second electrode of the first output reset transistor is connected to the first voltage end; and
a control electrode of the second output reset transistor is connected to the second pull-down node, a first electrode of the second output reset transistor is connected to the first voltage end, and a second electrode of the second output reset transistor is connected to the gate-driving-signal output end.

13. The shift register unit according to claim 9, wherein the shift register unit further comprises a reset circuit;
  the reset circuit is connected to the pull-up node, the first pull-down node, the second pull-down node, the first power voltage end and the clock signal input end, and is configured to control to electrically connect the clock signal input end to the second voltage end under control of the potential of the pull-up node, the potential of the first pull-down node, and the potential of the second pull-down node.

14. The shift register unit according to claim 13, wherein the reset circuit comprises a first reset transistor, a second reset transistor, and a third reset transistor;
  a control electrode of the first reset transistor is connected to the pull-up node, and a first electrode of the first reset transistor is connected to the clock signal input end;
  a control electrode of the second reset transistor is connected to the first pull-down node, a first electrode of the second reset transistor is connected to a second electrode of the first reset transistor, and a second electrode of the second reset transistor is connected to the second voltage end; and
  a control electrode of the third reset transistor is connected to the second pull-down node, a first electrode of the third reset transistor is connected to the second voltage end, and a second electrode of the third reset transistor is connected to the second electrode of the first reset transistor.

15. The shift register unit according to claim 1, wherein the output circuit comprises an output transistor and a storage capacitor;
  a control electrode of the output transistor is connected to the pull-up node, a first electrode of the output transistor is connected to the clock signal input end, and a second electrode of the output transistor is connected to the gate-driving-signal output end; and
  a first end of the storage capacitor is connected to the pull-up node, and a second end of the storage capacitor is connected to the gate-driving-signal output end.

16. The shift register unit according to claim 1, wherein the pull-up node control circuit comprises a first pull-up control transistor, a second pull-up control transistor, a third pull-up control transistor, a fourth pull-up control transistor, and a fifth pull-up control transistor;
  a control electrode of the first pull-up control transistor and a first electrode of the first pull-up control transistor are both connected to the input end, and a second electrode of the first pull-up control transistor is connected to the pull-up node;
  a control electrode of the second pull-up control transistor is connected to the initial reset end, a first electrode of the second pull-up control transistor is connected to the pull-up node, and a second electrode of the second pull-up control transistor is connected to the second voltage end;
  a control electrode of the third pull-up control transistor is connected to a first pull-down node, a first electrode of the third pull-up control transistor is connected to the second voltage end, and a second electrode of the third pull-up control transistor is connected to the pull-up node;
  a control electrode of the fourth pull-up control transistor is connected to a second pull-down node, a first electrode of the fourth pull-up control transistor is connected to the pull-up node, and a second electrode of the fourth pull-up control transistor is connected to the second voltage end; and
  a control electrode of the fifth pull-up control transistor is connected to the pull-up reset end, a first electrode of the fifth pull-up control transistor is connected to the pull-up node, and a second electrode of the fifth pull-up control transistor is connected to the second voltage end.

17. A display device comprising a gate driving circuit, the gate driving circuit comprising a plurality of the shift register units each according to claim 1.

18. The display device according to claim 17, wherein the discharge voltage end is configured to output a discharge voltage during the shutdown period of the display screen.

19. The display device according to claim 18, wherein a pixel circuit connected to the gate-driving-signal output end comprises a TFT, wherein
  the TFT is an N-type transistor, and a voltage value of the discharge voltage is positive; or
  the TFT is a P-type transistor, and the voltage value of the discharge voltage is negative.

20. The display device according to claim 18, wherein an absolute value of the discharge voltage is greater than or equal to 22V.

* * * * *